United States Patent
Panicke et al.

(10) Patent No.: US 11,073,590 B2
(45) Date of Patent: Jul. 27, 2021

(54) CALIBRATION DEVICE

(71) Applicant: Rosenberger Hochfrequenztechnik GmbH & Co. KG, Fridolfing (DE)

(72) Inventors: Marcel Panicke, Dresden (DE); Markus Müller, Dresden (DE); Ronny Mark, Dresden (DE)

(73) Assignee: ROSENBERGER HOCHFREQUENZTECHNIK GMBH & CO. KG, Fridolfing (DE)

( * ) Notice: Subject to any disclaimer, the term of this patent is extended or adjusted under 35 U.S.C. 154(b) by 0 days.

(21) Appl. No.: 16/093,500

(22) PCT Filed: Apr. 10, 2017

(86) PCT No.: PCT/EP2017/000458
§ 371 (c)(1),
(2) Date: Oct. 12, 2018

(87) PCT Pub. No.: WO2017/178107
PCT Pub. Date: Oct. 19, 2017

(65) Prior Publication Data
US 2019/0170844 A1 Jun. 6, 2019

(30) Foreign Application Priority Data
Apr. 13, 2016 (DE) .................... 10 2016 004 527.2

(51) Int. Cl.
*G01R 31/01* (2020.01)
*G01R 35/00* (2006.01)
(Continued)

(52) U.S. Cl.
CPC .......... *G01R 35/005* (2013.01); *G01R 27/28* (2013.01); *H01R 39/64* (2013.01); *H01R 24/547* (2013.01);
(Continued)

(58) Field of Classification Search
USPC ........................................................ 324/601
See application file for complete search history.

(56) References Cited

U.S. PATENT DOCUMENTS 5,565,785 A * 10/1996 Rodgers ............... H01C 17/235
324/601
5,578,932 A * 11/1996 Adamian ............. G01R 35/005
324/601
(Continued)

FOREIGN PATENT DOCUMENTS

CN 1993621 A 7/2007
DE 202007004296 U1 8/2007
(Continued)

OTHER PUBLICATIONS

Decision to Grant a Patent issued in the corresponding Korean Application No. 10-2018-7012930 dated Aug. 13, 2018; 4 pages.
(Continued)

*Primary Examiner* — Vincent Q Nguyen
(74) *Attorney, Agent, or Firm* — Fay Sharpe LLP

(57) ABSTRACT

A calibration array for calibrating a network analyzer, the array having multiple calibration points for direct or indirect connection to a network analyzer, and a main body connected to the calibration points, at least one of the calibration points being rotatable in relation to the main body.

14 Claims, 2 Drawing Sheets

(51) Int. Cl.
*G01R 27/28* (2006.01)
*H01R 39/64* (2006.01)
*H01R 103/00* (2006.01)
*H01R 24/54* (2011.01)

(52) U.S. Cl.
CPC ...... *H01R 2103/00* (2013.01); *H01R 2201/20* (2013.01)

(56) References Cited

U.S. PATENT DOCUMENTS

| | | | |
|---|---|---|---|
| 7,416,416 B1 | 8/2008 | Hsu | |
| 9,276,551 B1* | 3/2016 | Tsironis | H03J 3/00 |
| 9,722,569 B1* | 8/2017 | Tsironis | H03H 7/38 |
| 2008/0018342 A1* | 1/2008 | Hiebel | G01R 27/28 |
| | | | 324/601 |
| 2009/0149050 A1 | 6/2009 | Lyu et al. | |
| 2010/0156396 A1* | 6/2010 | Moroni | H01H 36/0033 |
| | | | 324/202 |

FOREIGN PATENT DOCUMENTS

| | | |
|---|---|---|
| EP | 1596479 A1 | 11/2005 |
| EP | 2031709 A1 | 3/2009 |
| JP | 2003078780 A | 3/2003 |
| JP | 2004109128 A | 4/2004 |
| JP | 2004361380 A | 12/2004 |
| JP | 2006317156 A | 11/2006 |
| JP | 2008514933 A | 5/2008 |
| JP | 2009093830 A | 4/2009 |
| JP | 2011150891 A | 8/2011 |
| JP | 2013207656 A | 10/2013 |

OTHER PUBLICATIONS

"OSLT compact calibration kit", spinner (website: http://rtelecom.net/userfiles/product_files_shared/Spinner/BN533844/533 844-DS.pdf, published on Jun. 9, 2011); 1 page.

Spotlight-High Frequency Performance Worldwide(spinner-group,published on Jan. 2014); 24 pages.

English translation of Notice of Rejection issued in the corresponding Korean Application No. 10-2018-7012930 dated Jun. 20, 2018; 6 pages.

English translation of Notification of the First Examination Report issued in the corresponding Chinese Application No. 201780010506.2 dated Apr. 29, 2019; 8 pages.

Rosenberger Hochfrequenztechnik GmbH & Co. KG: RPC-N Compact Calibration Kits—Datenblatt. 83413 Fridolfing, Oeutschland, 2015.—Firmenschrift; 2 pages.

Copper Mountain Technologies: Calibration Kit: 82611—Datenblatt. Indianapolis,USA, Jan. 15, 2016.—Firmenschrift; 2 pages.

Office Action issued in the corresponding Taiwan Application No. 10672150400 dated Sep. 21, 2017; 13 pages.

Spinner GmbH, Oslt Compact Calibration Kit (4-In-1), Data Sheet, XP055394694, The Whole Document, Retrieved From the Internet; URL:http://rtelecom.net/usertiles/productfiles_shared/Spinner/BN533844/533844-DS.pdf; Jun. 9, 2011; Retrieved From the Internet on Jun. 28, 2017.

Chinese Office Action issued in Application No. 201780010506.2 dated Sep. 18, 2019, with English Translation, 16 pages.

International Search Report and Written Opinion; issued in International Application No. PCT/EP2017/000458; dated Sep. 15, 2017.

Kuwahara Yoshihiko Yoshihikokuwahara, A principle of operation, a fundamental method of measurement, wireless component measurement, antenna measurement, etc. The network analyzer practice utilizing method, RF world No. 26 Radio Frequency, Japan, CQ publication incorporated company, May 1, 2014, p. 23-29. Relevant portions of document are the Figures.

Office Action in Japanese Patent Application No. 2018-542234 dated Mar. 12, 2021.

* cited by examiner

CALIBRATION DEVICE

FIELD OF THE INVENTION

The present invention relates to a calibration device and to an operating method for a calibration device.

TECHNICAL BACKGROUND

WO 2006/034801 makes it known that vector network analyzers must be calibrated before carrying out a measurement of the transmission and reflection coefficients of a device under test. In this case, coefficient measurements are carried out on each of several known calibration standards which are different from each other, on the basis of which error terms are calculated, with the aid of which system error corrections are carried out during the actual measurement of the object. The calibration standards which are used are, for example, an open calibration standard, a short calibration standard, a load calibration standard, a match calibration standard, or a thru calibration standard, which are connected one after the other to the measuring gate. It is known to arrange these calibration standards, for example, in a main body, from which connectors laterally protrude. Such a calibration unit including fixedly sized calibration points is connected to the corresponding measuring gates of the network analyzer for calibration via plug and cable.

EP 2 101 182 A2, for example, describes an arrangement for calibrating a vector network analyzer in a laboratory. In this case, various calibration components are connected to the network analyzer, one after the other. This arrangement can be disadvantageous, for example, when a network analyzer is to be calibrated in a field or in an outside area, since a substantial number of individual parts must be brought along for this purpose.

In order to avoid this, various compact calibration kits are known from the prior art, such as the Anritsu TOSLK (F) A-40 or the Spinner 533898.

The known prior art generally has mechanical disadvantages, however, which have a disadvantageous effect, for example, on the service life of the calibration kit, or electrical disadvantages which have a disadvantageous effect on the accuracy of the calibration.

This is a state which should be improved.

SUMMARY OF THE INVENTION

Against this background, the problem addressed by the present invention is that of providing an improved calibration arrangement.

According to the invention, this problem is solved by a calibration arrangement having the features of claim 1 and/or by a method having the features of claim 9.

Thus, the following is provided:
a calibration arrangement for calibrating a network analyzer, comprising
   multiple calibration points for the direct or indirect connection to a network analyzer;
   a main body which is connected to the calibration points;
   wherein at least one of the calibration points is rotatable with respect to at least one part of the main body (14, 16); and
a method for operating a calibration arrangement comprising multiple calibration points, which includes the following steps:
   connecting one calibration point of the calibration arrangement to a network analyzer for a match, a short, and/or an open, and carrying out the corresponding calibration;
   disconnecting the calibration arrangement and the network analyzer;
   rotating one part of the calibration arrangement, which includes a calibration point for establishing a thru to the network analyzer;
   establishing a thru between the calibration arrangement and the network analyzer.

The idea underlying the present invention is that of providing a calibration arrangement comprising multiple calibration points, wherein the calibration point for a thru is rotatable with respect to a main body of the calibration arrangement.

It is understood that the thru calibration point of a calibration arrangement is to comprise a thru connector pair which is referred to in the following as a through-connector. The present invention allows for a shorter design of the through-connector, since the dimensions of further connectors or calibration points of the calibration arrangement no longer must be taken into consideration with respect to the mechanical design of the through-connector. A shorter design is advantageous with respect to the electrical properties of the calibration arrangement and the quality of the calibration. In this way, for example, the number of support disks holding the inner conductor in the outer conductor can be reduced. Support disks are the cause, for example, of reflections of electrical signals.

The rotatability of the through-connector with respect to the main body of the calibration arrangement also extends the service life of a calibration arrangement with respect to a known calibration arrangement, the through-connector of which is offset by 90° with respect to the main body, but which is not rotatable.

Advantageous embodiments and refinements become apparent from the further dependent claims and from the description with reference to the figures of the drawing.

According to one preferred embodiment, the main body comprises a first main-body part and a second main-body part, wherein the second main-body part is rotatable with respect to the first main-body part. The coupling of the through-connector to the second main-body part has an advantageous effect on the service life of the calibration arrangement.

Alternatively, it is conceivable to structurally separate the through-connector from the main body and to merely design the through-connector to be rotatable.

According to yet another preferred embodiment, the first main-body part is connected to the second main-body part via at least one connecting element.

Alternatively, it is also conceivable that the first main-body part is directly screwed together with the second main-body part, for example by way of the two main body parts including corresponding threads.

According to yet another preferred embodiment, the at least one connecting element is designed as a screw, a pin, a magnet, or the like. In this way, the two main body parts are permanently connected to each other, which has an advantageous effect on the handling of the calibration arrangement according to the invention.

According to yet another preferred embodiment, the force to be applied in order to rotate the main body part is adjustable via the connecting element. For example, the force for rotating can be established by selecting a magnet strength of a connecting element which is designed as a magnet. Alternatively, it is possible to establish the force for rotating by way of the tightening of the connecting element which is designed as a screw. Provided the connecting element is designed as a pin, the force for rotating can be established by way of the length or thickness, via the friction force of the pin to be applied.

In this way, the force for rotating can be established in an application-specific manner during the assembly of the calibration arrangement.

According to yet another preferred embodiment, a spring for the threaded connection is situated in the first main body. As a result, a tolerance compensation can be provided or the holding force of the force-locked connection can be directly varied. Moreover, the spring reduces wear and tear on the calibration arrangement according to the invention resulting from the rotation.

According to yet another preferred embodiment, at least one disk, in particular a plastic disk, is formed in the main body. It is advantageous to situate the disk anywhere that different components are in contact with each other. The disk reduces wear and tear caused by abrasion of the two friction partners.

In particular, it is advantageous to situate the disk between the spring and the connecting element and/or between the spring and the first main body and/or between the first and the second main bodies. There is an increased potential for abrasion between the aforementioned components.

The embodiments and refinements presented above can be combined with each other in any meaningful way. Further possible embodiments, refinements, and implementations of the invention also include non-explicitly mentioned combinations of features of the invention described above or in the following with reference to the exemplary embodiments. In particular, a person skilled in the art will also add individual aspects as improvements or additions to the particular basic form of the present invention.

BRIEF DESCRIPTION OF THE DRAWING

The present invention is described in greater detail in the following with reference to the exemplary embodiments indicated in the schematic figures of the drawing. In the drawing.

Figure 1:
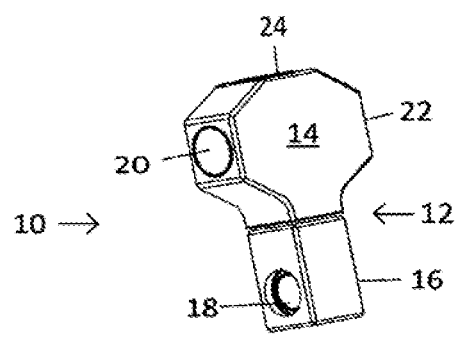
FIG. 1 shows a schematic perspective view of a calibration arrangement according to the invention.

The attached figures of the drawing are intended to enable a deeper understanding of the embodiments of the invention. They illustrate embodiments and are used in conjunction with the description to clarify principles and concepts of the invention. Other embodiments and many of the aforementioned advantageous become apparent in light of the drawings. The elements of the drawings are not necessarily shown true to scale with respect to each other.

In the figures of the drawing, identical, functionally identical, and identically acting elements, features and components are each provided with the same reference signs, unless stated otherwise.

DESCRIPTION OF EXEMPLARY EMBODIMENTS

Although the present invention has been described above in entirety with reference to preferred exemplary embodiments, it is not limited thereto, but rather can be modified in diverse ways.

FIG. 1 shows a first embodiment of a calibration arrangement 10 according to the invention. The calibration arrangement 10 comprises a main body which, in FIG. 1, is designed as a preassembled assembly. The main body 14 comprises a first main-body part 14 and a second main-body part 16. The first main-body part 14 comprises multiple calibration standards 20 (short), 22 (load/match), and 24 (open). The second main-body part 16 comprises a receptacle for a calibration standard 18 for a thru.

The first and the second main body parts 14, 16 are connected via a screw (not represented in FIG. 1). The two main-body parts 14, 16 are rotatable with respect to each other.

Figure 2:
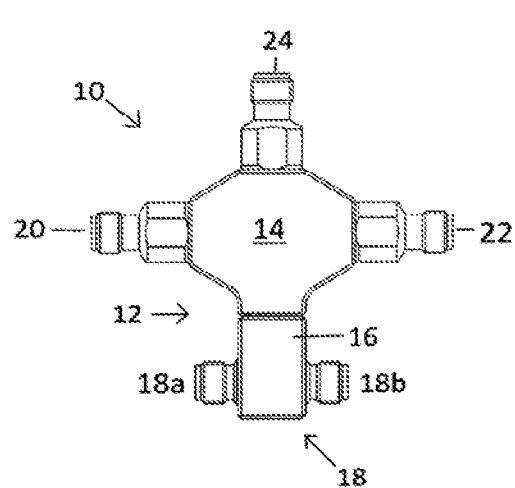
FIG. 2 shows a schematic front view of a calibration arrangement according to the invention in a first state.
Figure 3:
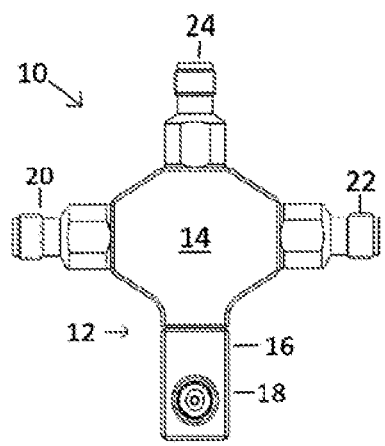
FIG. 3 shows a schematic front view of a calibration arrangement according to the invention in a second state.

The assembly of the calibration arrangement 10 in FIG. 1 has not yet been completed. FIGS. 2 and 3 show the calibration arrangement 10 according to FIG. 1 in a fully-assembled state. FIGS. 2 and 3 show a calibration arrangement 10 comprising connectors and calibration points.

In FIG. 2, it is apparent that the calibration standard 18 for a thru comprises a connector pair including the connectors 18a and 18b. The calibration arrangement 10 is represented in a first state in FIG. 2. In the state according to FIG. 2, the thru of the calibration arrangement 10 is possibly not connectable to a network analyzer, since the standards 20, 22 possibly protrude too far outward and could therefore impede a connection of the calibration points 18a, 18b. The state according to FIG. 2 can therefore also be referred to as a storage state. In particular, the calibration arrangement 10 in FIG. 2 comprises a flat bearing surface and is therefore better protected against scratching of or damage to the interface of the calibration connectors.

FIG. 3 shows the calibration arrangement 10 according to FIG. 2 in a second state. In FIG. 3, the second main-body part 16 has been rotated with respect to the first main-body part 14. In the state according to FIG. 3, a network analyzer (not represented) can be particularly easily connected to the standard 18 for a thru.

In contrast to FIG. 2, the state according to FIG. 3 is only conditionally suitable for the storage of the calibration arrangement 10, since the calibration arrangement could be easily scratched or exposed to other types of damage in the second state, particularly on the standards 18, 20, 22, 24 thereof, due to their uneven shape.

Figure 4:
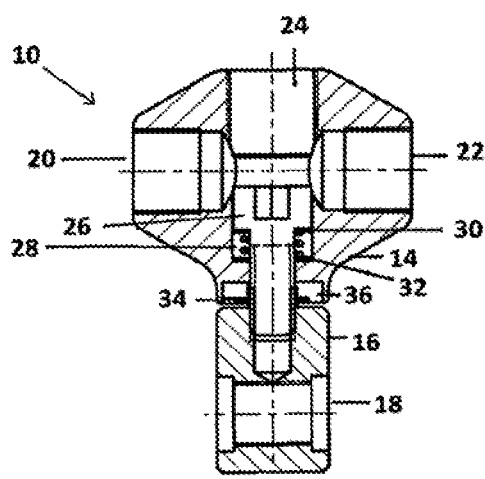
FIG. 4 shows a schematic section view of a first embodiment of a calibration arrangement according to the invention.

FIG. 4 shows a section view of a calibration arrangement 10 according to the invention, according to one of FIGS. 1 to 3. In FIG. 4, the calibration arrangement 10 comprises a screw 26 which connects the first main-body part 14 to the second main-body part 16. The screw 26 is situated in a hole in each of the two main-body parts 14, 16. The first main-body part 14 can be rotated with respect to the second main-body part 16, by way of the screw 26 "rotating along".

A spring 28 is situated between a stop, which the main-body part forms by means of the bottom of a blind hole in the main body 14, and the head of the screw 26. The spring 28 ensures a tolerance compensation and reduces wear and tear which are produced via the rotation. Moreover, the spring 28 ensures a certain amount of force to be applied, provided the screw is screwed in downward, i.e., in the direction of the second main body 16.

In order to prevent further wear and tear, the calibration arrangement 10 comprises a plastic disk 30 between the spring 28 and the head of the screw 26, which prevents the screw from rubbing on the spring 28. Another plastic disk 32 is therefore also situated between the spring 28 and the first main-body part 14.

The first main-body part 14 comprises, on its side directed toward the second main-body part 16, an approximately cloverleaf-shaped recess 36 which is designed as a milled recess. The second main-body part 16 comprises, on its side directed toward the first main-body part 14, a step 40 corresponding to the cloverleaf-shaped recess 36. The recess 36 and the step 40 are designed in such a way that the step 40 can engage with the recess 36 in two different positions lying at right angles with respect to each other. The recess 36 therefore forms a stop or a detent mechanism for the step 40.

In order to rotate the main body parts 14, 16 with respect to each other, a user pulls on the second main-body part 16, and therefore the spring 28 is compressed and the step 40 is pushed out of the recess 36.

It is understood that it is also possible to situate the screw 26 and the spring 28 in the calibration arrangement 10 in a mirror-image arrangement, and therefore the spring 28 as well as the head of the screw 26 are situated in the second main-body part 16.

Figure 5:
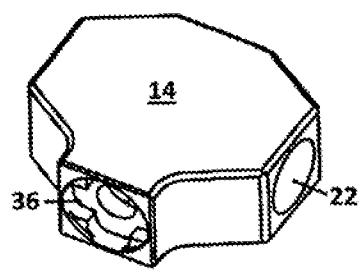
FIG. 5 shows a schematic perspective view of a first main-body part of a calibration arrangement according to the invention.

FIG. 5 shows the first main-body part 14 of the calibration arrangement 10 according to one of the FIGS. 1 to 4. FIG. 5 shows, in particular, the cloverleaf-shaped recess 36.

Figure 6:
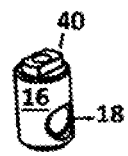
FIG. 6 shows a schematic perspective view of a second main-body part of a calibration arrangement according to the invention.

FIG. 6 shows the second main-body part 16 in a round design of the calibration arrangement 10 according to one of FIGS. 1 to 4. FIG. 6 shows, in particular, the step 40 which can engage with the recess 36 in different positions which are at a right angle with respect to each other.

In the case of an exemplary embodiment of a calibration arrangement 10 according to the invention, according to FIGS. 1 to 4, it is particularly advantageous that the first main-body part 14 and the second main-body part 16 are rotatable with respect to each other without the need to pull the second main-body part 16 out of the recess 36. To this end, the recess 36 is designed in such a way that the step 40 on the second main-body part 16 comprises a stop at a 90° angle with respect to the starting position. To this end, the screw 26 is tightened to such an extent that the spring force of the spring 28 offers holding force which is sufficient to prevent the second main-body part 16 from lifting away from the first main-body part 14. This simplifies the handling in a particularly intuitive way.

LIST OF REFERENCE SIGNS 10 calibration arrangement
12 main body
14 first main-body part
16 second main-body part
18 thru standard
18a thru connector
18b thru connector
20 short standard
22 open standard
24 load standard
26 screw
28 spring
30 plastic disk
32 plastic disk
34 plastic disk
36 receptacle
40 step

The invention claimed is:

1. A calibration device for calibrating a network analyzer, comprising
   a main body; and
   multiple calibration points on the main body for direct or indirect electrical connection to a network analyzer, and including (A) at least one of a short, a load/match, or an open, and (B) a thru;
   wherein at least one of the calibration points is rotatable relative to at least one part of the main body.

2. The calibration device as claimed in claim 1, wherein the main body comprises a first main-body part and a second main-body part, wherein the second main-body part is rotatable with respect to the first main-body part.

3. A calibration device for calibrating a network analyzer, comprising
   a main body comprising a first main-body part and a second main-body part; and
   multiple calibration points on the main body for direct or indirect electrical connection to a network analyzer, and including (A) at least one of a short, a load/match, or an open, and (B) a thru;
   wherein at least one of the calibration points is on the second main-body part and the second main-body part is rotatable with respect to the first main-body part; and
   wherein the first main-body part is connected to the second main-body part via at least one connecting element.

4. The calibration device as claimed in claim 3, wherein the at least one connecting element is designed as a screw, a driver pin, or a magnet.

5. The calibration device as claimed in claim 3, wherein a force necessary for rotating the first and/or the second main-body part is adjustable via the connecting element.

6. The calibration device as claimed in claim 3, wherein a spring is arranged in the first main-body part and/or in the second main-body part.

7. The calibration device as claimed in claim 6, wherein at least one disk, is formed in the main body.

8. The calibration device as claimed in claim 7, wherein the at least one disk is situated between the spring and the connecting element, or between the spring and the main-body part in which the spring is arranged, or between the first main-body part and the second main-body part.

9. The calibration device as claimed in claim 6, wherein the first main-body part comprises a cloverleaf-shaped recess; and the second main-body part comprises a step that engages the cloverleaf-shaped recess.

10. The calibration device as claimed in claim 3, wherein the multiple calibration points include a short, and a load/match, and an open, and a thru; and
    wherein the short, the load/match, and the open calibration points are located on the first main-body part, and the thru calibration point is located on the second main-body part.

11. A calibration device for calibrating a network analyzer, comprising
    a main body comprising a first main-body part and a second main-body part, wherein the second main-body part is rotatable with respect to the first main-body part;
    wherein the first main-body part includes a short calibration point, a load/match calibration point, and an open calibration point; and wherein the second main-body part includes a thru calibration point comprising a pair of connectors.

12. The calibration device of claim 11, wherein the first main-body part is connected to the second main-body part by a screw that is situated in a hole in each of the first main-body part and the second main-body part.

13. The calibration device of claim 12, further comprising a spring situated between a bottom of the hole in the first main-body part and a head of the screw.

14. The calibration device of claim 11, wherein the first main-body part comprises a cloverleaf-shaped recess; and the second main-body part comprises a step that engages the cloverleaf-shaped recess.

* * * * *